United States Patent [19]
Tung et al.

[11] Patent Number: 6,150,678
[45] Date of Patent: Nov. 21, 2000

[54] METHOD AND PATTERN FOR AVOIDING MICRO-LOADING EFFECT IN AN ETCHING PROCESS

[75] Inventors: Chia-Ching Tung, Kaohsiung; Cheng-Lung Lu, Hsinchu; Hung-Yi Luo, Taipei, all of Taiwan

[73] Assignee: Vanguard International Semiconductor Corporation, Hsinchu, Taiwan

[21] Appl. No.: 09/248,582

[22] Filed: Feb. 11, 1999

[51] Int. Cl.[7] .................................................. H01L 27/10
[52] U.S. Cl. .......................... 257/202; 257/210; 257/211; 257/224; 438/18; 438/719; 438/720; 438/725
[58] Field of Search ............................. 257/48, 306, 210, 257/211, 224, 758, 773, 202; 438/706, 720, 719, 725, 18

[56] References Cited

U.S. PATENT DOCUMENTS

| | | | |
|---|---|---|---|
| 4,916,514 | 4/1990 | Nowak | 257/758 |
| 5,032,890 | 7/1991 | Ushiku et al. | 257/211 |
| 5,278,105 | 1/1994 | Eden et al. | 438/129 |
| 5,598,010 | 1/1997 | Uematsu | 257/48 |
| 5,684,316 | 11/1997 | Lee | 257/306 |

*Primary Examiner*—Benjamin L. Utech
*Assistant Examiner*—Binh X Tran
*Attorney, Agent, or Firm*—Christensen O'Connor Johnson Kindness PLLC

[57] ABSTRACT

A method for avoiding micro-loading effect during etching is disclosed. The method comprises the steps of: providing a semiconductor substrate with a layer to be patterned and etched formed thereover; forming a masking layer over the layer to be patterned; defining a row pattern in the masking layer, the row pattern comprising a plurality of rectangles and a plurality of connecting bars, each of the connecting bars connecting two of the rectangles; and removing a portion of the layer to be patterned, to form a patterned layer with a recessed channel, by using the masking layer as a mask with the row pattern.

7 Claims, 4 Drawing Sheets

METHOD AND PATTERN FOR AVOIDING MICRO-LOADING EFFECT IN AN ETCHING PROCESS

TECHNICAL FIELD OF THE INVENTION

The present invention relates to a semiconductor fabrication process, and more specifically, to a method and a pattern for avoiding the micro-loading effect in an etching process.

BACKGROUND OF THE INVENTION

The packing density of an integrated circuit chip has been continuously raised in the last decade to include millions, or even billions of devices on a single chip. Process technology must therefore be advanced to fabricate integrated circuits with high yield and minimal cost. Thus, some of the most important aspects of semiconductor processing technology, like lithography, etching, deposition, and thermal processing, are being developed aggressively.

Etching plays a vital role in defining prescribed patterns in the semiconductor substrate or subsequent layers. An ideal etching process must transfer the pattern on a masking layer to an underlying layer accurately, and also stop at a predetermined depth. In an anisotropic etching process like a plasma-enhanced etching or reactive ion etching (RIE) process, the pattern on a masking layer is transferred with the least distortion to form an etched region with perpendicular sidewall and expected bottom height.

However, since the etching process removes a target material both chemically and physically, the etching process is very sensitive to a lot of environmental parameters. One of the most challenging factors in traditional etching control is the micro-loading effect. Generally speaking, a semiconductor substrate with a layer to be patterned is subjected to an etching process to define a pattern with a plurality of regions. The regions may be distributed with variant sizes and locations on the chip. The density in the distribution of regions is usually different across the chip or the wafer. Under the chemical and physical reacting mechanism of the etching process, the characteristics of etching are different under the variations of pattern size and density, or namely the variation of "loading".

Referring to FIG. 1a, a schematic top view of a portion of an etching pattern on a semiconductor substrate is illustrated. The shaded area indicates the area to be removed. The pattern may contain several regions with uniform size and density, like regions 10a, 10b, 10c, 12a, 12b, and 12c. The pattern also contains a region 14 for defining a long line. As an example, the pattern can be a contact region pattern for defining contact holes and lines down to an underlying conductive layer. Therefore, the regions are expected to extend down to the same depth reaching an underlying layer. However, because of the loading effect, different pattern regions are etched to different depths.

As shown in FIG. 1b, a cross sectional view of a dielectric layer 16 after the etching process along section line A—A in FIG. 1a. The recessed regions 20 and 22 are respectively formed under the defined regions 10b and 12b. The regions 20 and 22 are formed with the same depth under the uniform dimension and distribution of the defined regions 10a and 12a. However, the recessed region 24 formed under a defined region 14 of extended line area is found to be over-etched with enlarged depth. The non-uniform etching under varied etching loading is called the "micro-loading effect".

With the micro-loading effect, the etching depth of different regions are hard to control. In the example of forming contact holes or lines, a conductive layer 18 underlying the patterned dielectric layer 16 might be damaged under the over-etching of the micro-loading effect. The conductive layer 18 might be broken as shown in FIG. 1b. Besides, other layers underlying the conductive layer 18 can also be damaged under severe over-etching.

SUMMARY OF THE INVENTION

A method for avoiding micro-loading effect during etching is disclosed. The method comprises the steps of: providing a semiconductor substrate with a layer to be patterned and etched formed thereover; forming a masking layer over said layer to be patterned; defining a row pattern in said masking layer, said row pattern comprising a plurality of rectangles and a plurality of connecting bars, each of said connecting bars connecting two of said rectangles; and removing a portion of said layer to be patterned, to form a patterned layer with a recessed channel, by using said masking layer as a mask with said row pattern.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows:

FIG. 1b illustrates a cross sectional view of a prior art patterned layer along section line A—A in FIG. 1a;

FIG. 2b illustrates a cross sectional view of a patterned layer along a section line B—B in FIG. 2a;

DETAILED DESCRIPTION OF THE PREFERRED EMBODIMENT

The present invention discloses a method for avoiding the micro-loading effect in an etching process is disclosed. Further, a pattern for avoiding the micro-loading effect is also disclosed. A defined pattern with extended length, like a wafer testing pattern or a chip testing pattern for testing electrical characteristics, can be modified to a combination of a plurality of regions. The micro-loading effect can be avoided with the distribution and adjustment in the size of the consisting regions. The connecting purpose of the pattern with extended length can still be maintained.

Figure 1A:
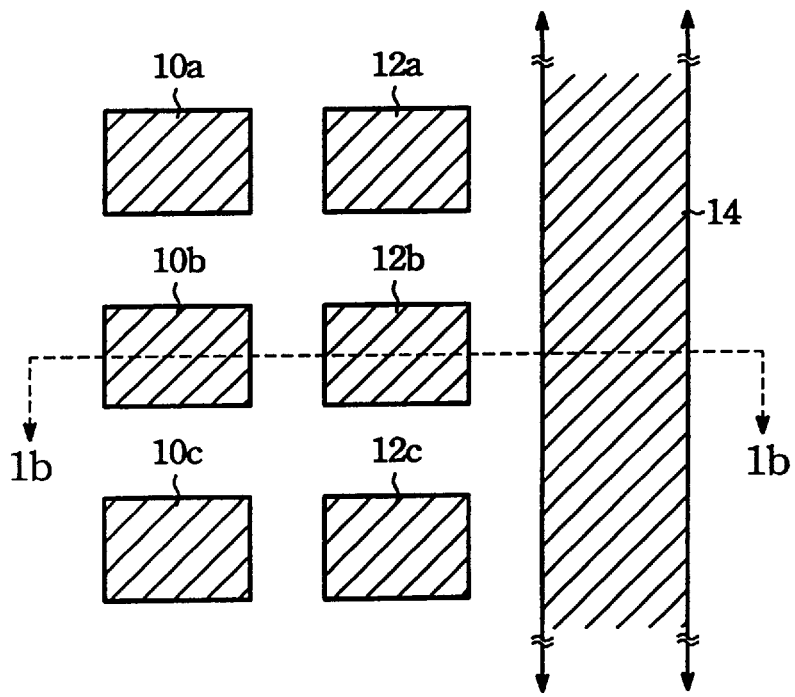
FIG. 1a is a schematic top view of an prior art etching pattern on a semiconductor substrate.
Figure 1B:
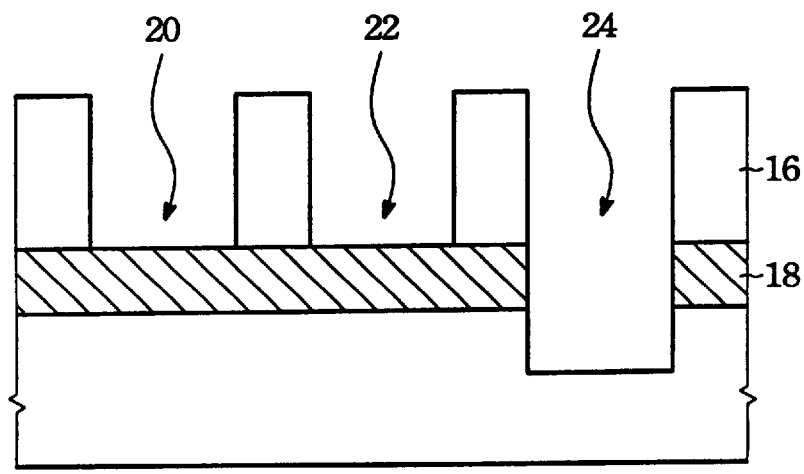
Figure 2A:
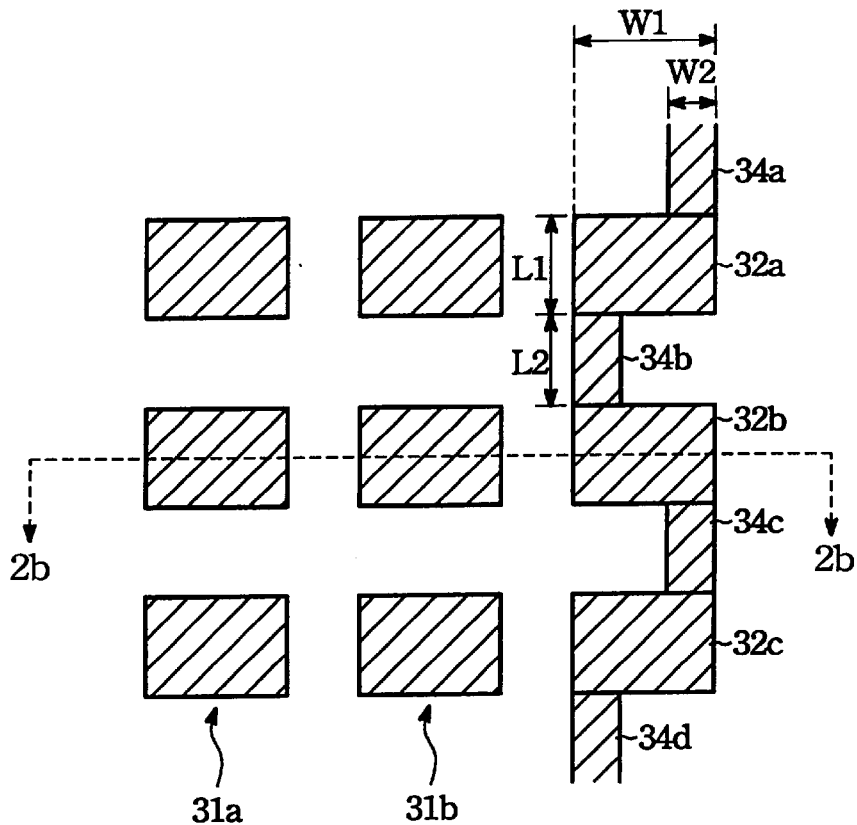
FIG. 2a illustrates a schematic top view of an etching pattern on a semiconductor substrate in accordance with the present invention.

Referring to FIG. 2a, a row pattern for avoiding micro-loading effect in an etching process is illustrated. The row pattern 30 includes a plurality of identical rectangles 32a, 32b, and 32c, and a plurality of connecting bars 34a, 34b, 34c, and 34d. Each of the connecting bars interconnect two of the rectangles. In the embodiment illustrated in this case, the row pattern is a region of a wafer testing pattern or chip testing pattern for testing electric characteristic of integrated circuits. In the fabricating process of integrated chips, an extended row of contact regions is formed to contact a plurality of underlying ends for testing characteristics. In some occasions, several extended rows of contact regions are formed in parallel to test dielectric characteristics.

Therefore, for defining the contact region in this case, the row pattern can be defined on a masking layer which is a top lying mask for the etching process. In the lithography process, the row pattern can be defined on a photomask being transferred onto a masking layer in an exposure process.

With the row pattern proposed in the present invention, a pattern with extended length can be divided into connecting rectangles and bars without breaking or splitting the pattern. The micro-loading effect of etching can be reduced by employing the modified pattern. In this case, each rectangle can have the length L1, along a longitudinal direction of the row pattern, approximately equal to about 1 to 5 times of the length L2, of each connecting bar 34 along the longitudinal direction. Further, the rectangles can have the width W1 of about 2 times to about 5 times of the width W2 of the connecting bars.

In the example shown, the width WI of the rectangles and the width W2 of the connecting bars are measured perpendicular to a longitudinal direction of the row pattern. To increase the prevention of the micro-loading effect, the connecting bars can be distributed non-symmetrically along the longitudinal direction of the row pattern 30. As an example, the connecting bar 34a is placed at the right edge of the rectangles, and the next connecting bar 34b is placed at the left edge of the rectangles. The connecting bars 34c, 34d and other connecting bars not shown can be distributed in the same non-symmetric or right and left crossing way without being aligned in a straight line.

Figure 2B:
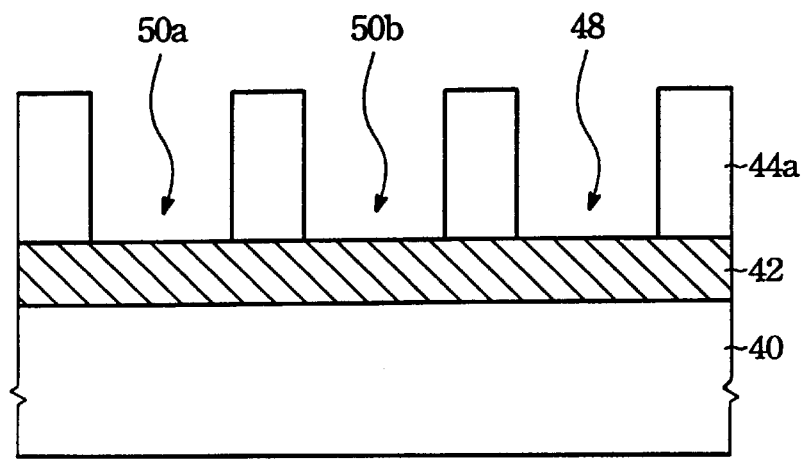

An example of an etched dielectric layer 44a on a semiconductor substrate 40 is shown in FIG. 2b, which is taken along section line B—B in FIG. 2a. The contact region 50a, 50b, and 48, which are formed respectively under the region 31a, 31b, and 32b, can be etched with the same depth without damaging the underlying conductive layer 42. Thus the micro-loading effect can be eliminated with the connective regions and the non-aligned distribution of the connecting bars in the present invention.

Figure 3:
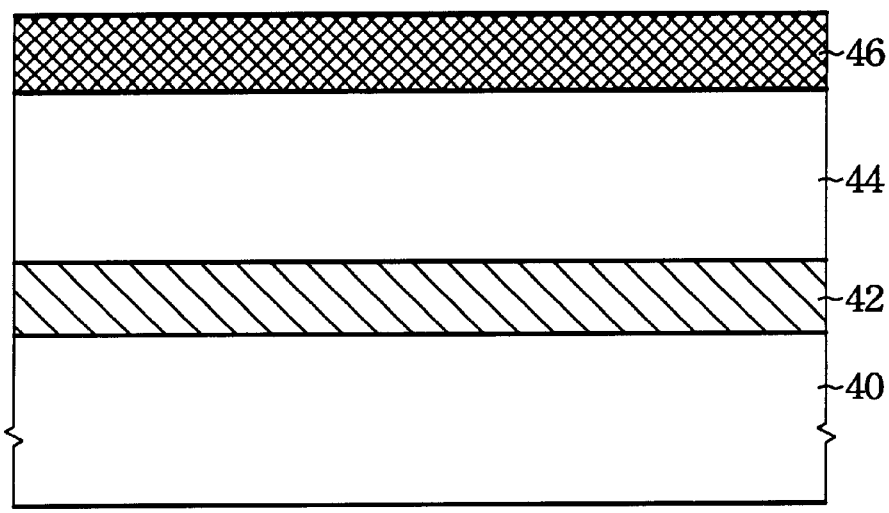
FIG. 3 illustrates a cross sectional view of forming a masking layer over a semiconductor substrate in accordance with the present invention.
Figure 4:
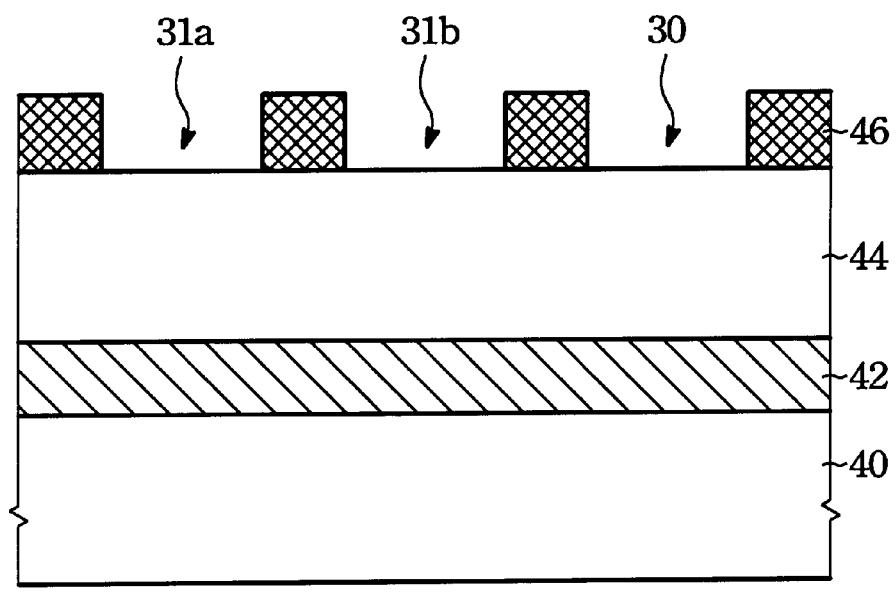
FIG. 4 illustrates a cross sectional view of defining a row pattern and other contact hole regions in the masking layer in accordance with the present invention.

With the row pattern described as above, the method for avoiding micro-loading effect is disclosed as follows. Referring to FIG. 3, the semiconductor substrate 40 is illustrated in a cross sectional view. The substrate 40 is provided with a layer to be patterned 44 being formed over it. For forming a recessed region like contact holes, the layer to be patterned 44 may be a dielectric layer and have an underlying layer 42 of conductive material. The dielectric layer 44 can be a silicon oxide layer or a silicon nitride layer. A masking layer 46 is then formed over the layer 44 to be patterned. The masking layer 46 can be a photoresist layer. A row pattern 30 is then defined in the masking layer 46, as shown in FIG. 4. The top view of the row pattern 30 is illustrated in FIG. 2a. The cross sectional view in FIG. 4 is taken along section line B—B in FIG. 2a. Other regions of contact holes, like the regions of contact hole 31a and 31b, can also be defined at the same time.

Figure 5:
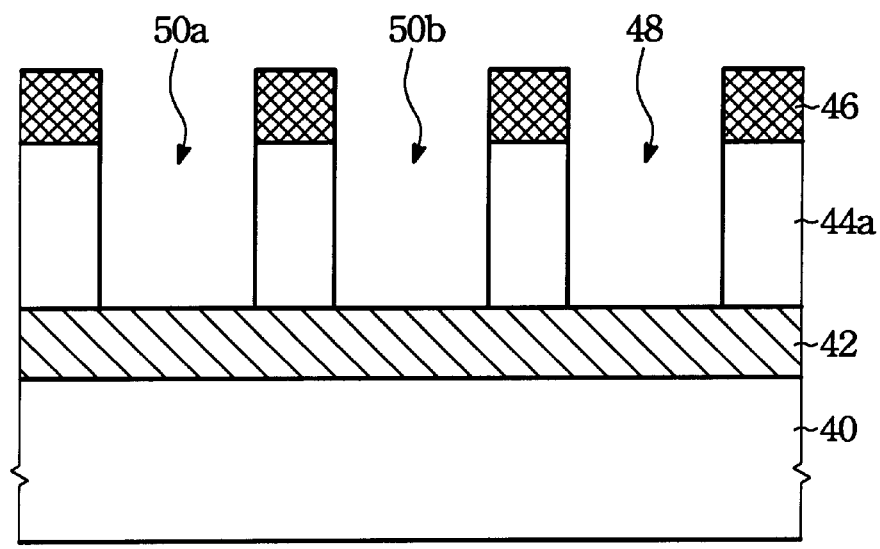
FIG. 5 illustrates a cross sectional view of removing a portion of the layer to be patterned, to form a patterned layer with a recessed channel and contact holes in accordance with the present invention.

Referring to FIG. 5, after defining the row pattern 30 on the masking layer 46, a portion of the layer to be patterned 44 can then be removed to form a patterned layer 44a with a recessed channel 48, by using the masking layer 46 as a mask with the row pattern 30. Other contact holes 50a and 50b can also be defined at the same time. With the row pattern 30 of the present invention, the recessed channel 48 can be defined with the same depth with other contact holes 50a and 50b. The micro-loading effect can be eliminated. The etching process can be well controlled to stop at the underlying layer 42 to make contacts in later processes.

Figure 6:
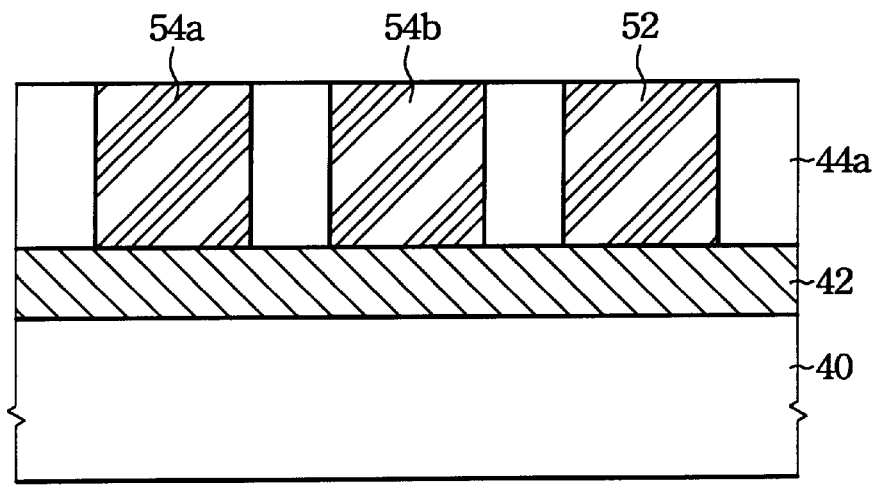
FIG. 6 illustrates a cross sectional view of removing the masking layer and forming conductive material in the recessed channel in accordance with the present invention.

For finishing a conductive line in the defined recessed channel 48, a series of subsequent steps can be performed. The masking layer 46 for defining the pattern is removed, as shown in FIG. 6. The recessed channel 48 and contact holes 50a and 50b are then filled with a conductive material to form a testing line 52 and contacts 54a and 54b. The testing line 52 can then be employed to test the electrical characteristics of the substrate 40 with devices formed thereover.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded the broadest interpretation so as to encompass all such modifications and similar structures.

What is claimed is:

1. A row pattern for avoiding micro-loading effect in an etching process, said row pattern comprising:

a plurality of rectangles; and a plurality of connecting bars, each of said connecting bars interconnecting every two of said rectangles, said rectangles have a length along a longitudinal direction of said row pattern approximately equal to about 1 to 5 times of a length of said connecting bars, said rectangles have a width of about 2 times to about 5 times of a width of said connecting bars, said width of said rectangles and said width of said connecting bars being measured perpendicular to a longitudinal direction of said row pattern.

2. The row pattern of claim 1, wherein said row pattern is defined on a photomask for defining a pattern onto a masking layer.

3. The row pattern of claim 1, wherein said row pattern is a wafer testing pattern for testing electric characteristic of integrated circuits.

4. The row pattern of claim 1, wherein said row pattern is defined in a dielectric layer.

5. The row pattern of claim 1, wherein said row pattern is a pattern of a conductive wafer testing line.

6. The row pattern of claim 1, wherein said row pattern is defined on a masking layer for said etching process.

7. The row pattern of claim 6, wherein said masking layer comprises a photoresist layer.

* * * * *